United States Patent
Cormier, Jr.

(10) Patent No.: US 8,854,059 B2
(45) Date of Patent: Oct. 7, 2014

(54) EMBEDDED SAR BASED ACTIVE GAIN CAPACITANCE MEASUREMENT SYSTEM AND METHOD

(75) Inventor: Ronald F. Cormier, Jr., Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 584 days.

(21) Appl. No.: 13/194,605

(22) Filed: Jul. 29, 2011

(65) Prior Publication Data

US 2011/0279170 A1 Nov. 17, 2011

(51) Int. Cl.

| G01R 27/26 | (2006.01) |
|---|---|
| H03K 17/96 | (2006.01) |
| G06F 3/045 | (2006.01) |
| G06F 3/044 | (2006.01) |
| G01D 15/00 | (2006.01) |
| G01D 1/00 | (2006.01) |
| G01D 21/00 | (2006.01) |

(52) U.S. Cl.
CPC ................ G06F 3/044 (2013.01); *G01D 15/00* (2013.01); *G01D 1/00* (2013.01); G01R 27/2605 (2013.01); *G01D 21/00* (2013.01); *G06F 2203/0336* (2013.01)
USPC ............................ 324/678; 327/517; 345/174

(58) Field of Classification Search
CPC ...... G06F 3/044; G06F 3/0416; G06F 3/0418; H03K 17/955; H03K 17/96; G01R 27/2605; G01D 1/00; G01D 15/00; G01D 21/00
USPC ............................ 324/678; 345/174; 327/517
See application file for complete search history.

(56) References Cited

U.S. PATENT DOCUMENTS

| 4,459,541 | A | 7/1984 | Fielden et al. | |
|---|---|---|---|---|
| 7,098,675 | B2 | 8/2006 | Inaba et al. | |
| 7,129,714 | B2 | 10/2006 | Baxter | |
| 7,205,776 | B2 | 4/2007 | Kinoshita et al. | |
| 7,288,946 | B2 | 10/2007 | Hargreaves et al. | |
| 7,301,350 | B2 | 11/2007 | Hargreaves et al. | |
| 7,705,755 | B2 | 4/2010 | Yang et al. | |
| 7,724,000 | B2 | 5/2010 | Grosjean et al. | |
| 7,804,307 | B1 | 9/2010 | Bokma et al. | |
| 7,982,471 | B2 * | 7/2011 | Mueck et al. | 324/686 |
| 8,018,238 | B2 * | 9/2011 | Cormier, Jr. | 324/678 |
| 8,368,409 | B2 * | 2/2013 | Mueck et al. | 324/678 |
| 8,624,871 | B2 * | 1/2014 | Nihei et al. | 345/174 |
| 2009/0244014 | A1 * | 10/2009 | Hotelling et al. | 345/173 |
| 2010/0231241 | A1 * | 9/2010 | Mueck et al. | 324/686 |
| 2010/0244858 | A1 * | 9/2010 | Cormier, Jr. | 324/678 |
| 2010/0244859 | A1 | 9/2010 | Cormier, Jr. et al. | |
| 2011/0109585 | A1 * | 5/2011 | Kwon et al. | 345/174 |
| 2011/0234534 | A1 * | 9/2011 | Mueck et al. | 345/174 |
| 2013/0106444 | A1 * | 5/2013 | Mueck et al. | 324/679 |
| 2014/0035862 | A1 * | 2/2014 | Jeong et al. | 345/174 |

* cited by examiner

*Primary Examiner* — Jermele M Hollington
(74) *Attorney, Agent, or Firm* — Alan A. R. Cooper; Frederick J. Telecky, Jr.

(57) ABSTRACT

A system for measuring a capacitor ($C_{SENj}$) precharges a CDAC (23) in a SAR converter (17) to a reference voltage ($V_{AZ}$) and also precharges a first terminal (3-$j$) of the capacitor to another reference voltage (GND). During a measurement phase, the CDAC is coupled between an output and an input of an amplifier (31) and the capacitor also is coupled to the input of the amplifier, so as to redistribute charge between the capacitor and the CDAC. The amplifier generates an output voltage ($V_{AMP}$) representing the capacitance being measured. The output voltage is stored in the CDAC. The SAR converter converts the output voltage to a digital value representing the capacitance being measured.

5 Claims, 9 Drawing Sheets

EMBEDDED SAR BASED ACTIVE GAIN CAPACITANCE MEASUREMENT SYSTEM AND METHOD

CROSS-REFERENCE TO RELATED APPLICATIONS

This Application is a continuation of U.S. patent application Ser. No. 12/383,696, entitled "EMBEDDED SAR BASED ACTIVE GAIN CAPACITANCE MEASUREMENT SYSTEM AND METHOD," filed on Mar. 27, 2009, now U.S. Pat. No. 8,018,238, which is hereby incorporated by reference for all purposes.

TECHNICAL FIELD

The present invention relates generally to circuits and techniques for measurement of capacitance, and more particularly, to such circuits and techniques adapted for use in touch-screen, touch button, and, touch-pad applications.

BACKGROUND

Touch screen controller circuits for use in touch screen, touch pad, and touch button applications have generally included digital controller circuitry and analog circuitry for detecting/measuring the presence of capacitance if a user touches a point on a touch screen (or a touch pad or touch button). The presence or movement of a user's finger in the vicinity of the electric field associated with the capacitance of the touch screen, touch button, etc., disturbs or impedes the electric field and therefore modifies the capacitance. The capacitance detecting/measuring circuit therefore indicates the presence of the finger as a change in the modified touch screen or touch button capacitance. The prior art typically utilizes current sourcing/sinking circuitry, RC networks, and counters to provide a digital indication of the measured capacitance, which, in a touch screen controller, can be used to precisely identify/indicate the screen location being touched.

Figure 1A:
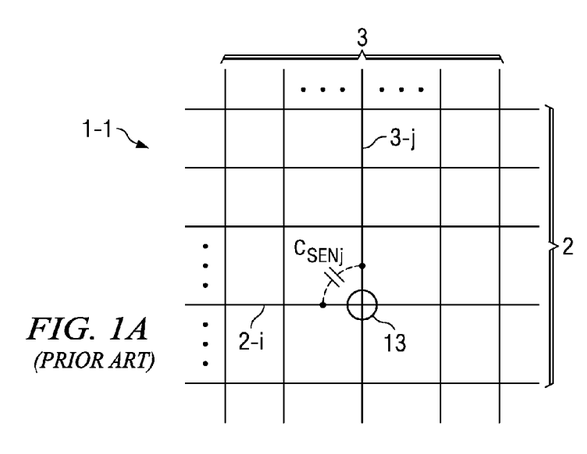
FIG. 1A illustrates a plan view diagram of upper and lower orthogonal transparent, conductive strips of a touch screen panel.

FIG. 1A illustrates part of a touch screen panel 1-1 which includes a suitable number of horizontal transparent conductors 2 disposed on one surface of a thin, transparent insulative layer (not shown). A suitable number of vertical transparent conductors 3 are disposed on the other surface of the insulative layer. The left end of each of the horizontal conductors 2 can be connected to suitable current sourcing or drive circuitry. The bottom end of each of the vertical conductors 3 can be connected to suitable current sinking or receiving circuitry. A cross-coupling capacitance $C_{SENj}$ occurs at an "intersection" of each horizontal conductor such as 2-I and each vertical conductor such as 3-j, the intersection being located directly beneath a "touch point" 13. Note that the touching by a user's finger does not necessarily have to occur directly over a touch point. If multiple touch points 13 are sufficiently close together, then a single touching may disrupt the electric fields of a number of different cross-coupling capacitances $C_{SENj}$. However, the largest change in the value of a particular cross-coupling capacitance $C_{SENj}$ occurs when the touching occurred directly over that particular cross-coupling capacitance.

Figure 1B:
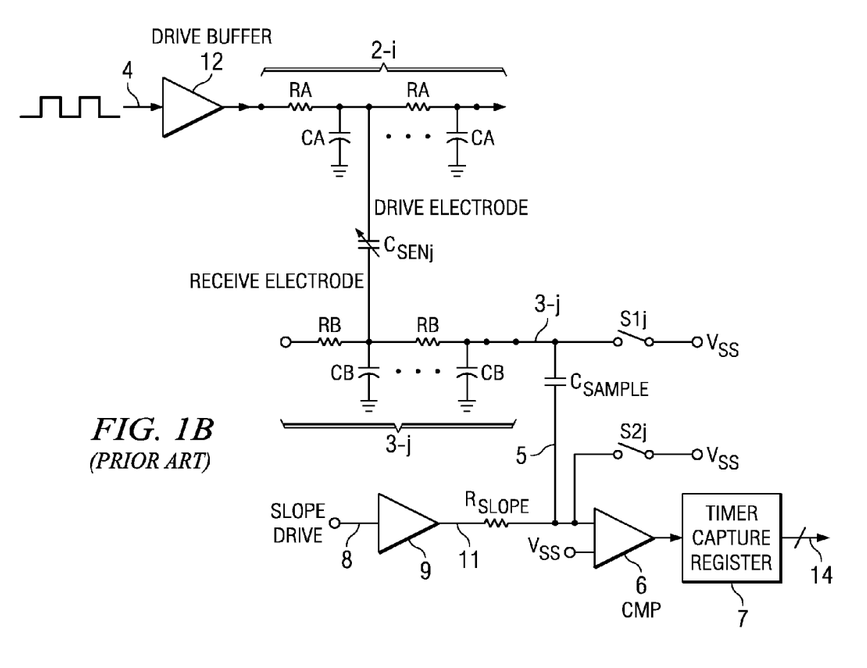
FIG. 1B is a schematic diagram representing circuitry associated with an "intersection" of a horizontal conductive, transparent strip and a vertical conductive, transparent strip of a touch screen panel, cross coupling capacitance, and circuitry for sensing the presence of a person's finger close to the intersection.

FIG. 1B illustrates any particular horizontal conductor 2-I and any particular vertical (as in FIG. 1A) conductor 3-j and the associated cross-coupling capacitance $C_{SENj}$ between them, I and j being row and column index numbers of the horizontal conductors 2 and the vertical conductors 3, respectively. (By way of definition, the structure including the overlapping conductors 2-I and 3-j which result in the cross-coupling capacitance $C_{SENj}$ is referred to as "capacitor $C_{SENj}$". That is, the term "$C_{SENj}$" is used to refer both to the capacitor and its capacitance.)

The drive circuitry for horizontal conductor 2-I can include a drive buffer 12 which receives appropriate pulse signals on its input 4. The output of drive buffer 12 is connected to the right end of conductor 2-I, which is modeled as a series of distributed resistances RA and distributed capacitances CA each connected between ground and a node between two adjacent distributed resistances RA. The receive circuitry for conductor 3-j is illustrated as being connected to the right end of vertical conductor 3-j. A switch S1j is connected between conductor 3-j and $V_{SS}$. A sampling capacitor $C_{SAMPLE}$ has one terminal connected to conductor 3-j and another terminal connected by conductor 5 to an input of a comparator 6, one terminal of a switch S2j, and one terminal of a resistor $R_{SLOPE}$. The other terminal of switch S2j is connected to $V_{SS}$. The other terminal of resistor $R_{SLOPE}$ is connected to the output of a slope drive amplifier 9, the input of which receives a signal SLOPE DRIVE. The other input of comparator 6 is connected to $V_{SS}$. The output of comparator 6 is connected to an input of a "timer capture register" 7, which can be a counter that, together with resistor $R_{SLOPE}$ and capacitor $C_{SAMPLE}$, perform the function of generating a digital output signal on bus 14 representing the value of $C_{SENj}$.

A problem of the above described prior art is that the time required for the capacitance measurement is time-varying in the sense that a lower value of the capacitance $C_{SENj}$ requires less counting time by timer capture register 7, whereas a higher value of the capacitance $C_{SENj}$ requires more counting time by timer capture register 7. The widely variable capacitance measurement times may be inconvenient for a user. Also, the system is quite susceptible to noise because comparator 6 in Prior Art FIG. 1B is connected via $C_{SAMPLE}$ during the entire capacitance measurement process.

A shortcoming of passive capacitance measurement system 15 as shown in FIG. 2A of the co-pending applications is that its sensitivity is limited by the ratio of the measured capacitance $C_{SENj}$ to the CDAC capacitance. The capacitance measurement system shown in FIG. 2A of the co-pending applications can measure a value of $C_{SENj}$ in the range from 0 pF (picofarads) to roughly 30 pF. However, it would be desirable in some applications to provide an improved capacitance measurement system having greater sensitivity, i.e., greater measured capacitance per LSB of DATA<11:0> than can be achieved using the system shown in FIG. 2A of the above-mentioned co-pending applications.

Thus, there is an unmet need for a capacitance measurement system that is capable of making accurate measurements of a broader range of capacitances than the prior art.

There also is an unmet need for an improved digital circuit and method for making touch screen capacitance measurements in a touch screen controller circuit.

There also is an unmet need for an improved digital circuit and method for making touch screen capacitance measurements in a touch button controller circuit.

There also is an unmet need for a digital capacitance measurement system and method having greater capacitance measurement sensitivity than the prior art.

There also is an unmet need for a digital capacitance measurement system and method having greater capacitance per LSB measurement sensitivity than the prior art.

There also is an unmet need for a digital capacitance measurement system and method having greater touch screen capacitance per LSB measurement sensitivity than the prior art and the capacitance measurement system described in the co-pending U.S. patent application Ser. No. 12/381,741 (now U.S. Pat. No. 7,982,471), entitled "CAPACITANCE MEASUREMENT SYSTEM AND METHOD," filed on Mar. 27, 2009, and U.S. patent application Ser. No. 13/151,712, entitled "CAPACITANCE MEASUREMENT SYSTEM AND METHOD," filed on Jun. 2, 2011, where each co-pending application is hereby incorporated by reference for all purposes application.

There also is an unmet need for a digital capacitance measurement system and method having the ability to compensate for large parasitic capacitances.

There also is an unmet need for a digital capacitance measurement system and method which is conveniently configurable to provide different precharge strategies to accommodate various parasitic capacitances.

SUMMARY

It is an object of the invention to provide a capacitance measurement system that is capable of making accurate measurements of a broader range of capacitances than the prior art.

It is another object of the invention to provide an improved digital circuit and method for making touch screen capacitance measurements in a touch screen controller circuit.

It is another object of the invention to provide an improved digital circuit and method for making touch screen capacitance measurements in a touch button controller circuit.

It is another object of the invention to provide a digital capacitance measurement system and method having greater capacitance measurement sensitivity than the prior art.

It is another object of the invention to provide a digital capacitance measurement system and method having greater capacitance per LSB measurement sensitivity than the prior art.

It is another object of the invention to provide a digital capacitance measurement system and method having greater touch screen capacitance per LSB measurement sensitivity than the prior art and of the above mentioned co-pending applications.

It is another object of the invention to integrate a CDAC (capacitor digital-to-analog converter) in a feedback network of a transconductance amplifier in order to use CDAC capacitors both for charge redistribution with a capacitance to be measured and also for performing a SAR conversion of a voltage representing the capacitance to be measured to a digital representation thereof.

It is another object of the invention to provide a digital capacitance measurement system and method having the ability to compensate for large parasitic capacitances.

It is another object of the invention to provide a digital capacitance measurement system and method which is conveniently configurable to provide different precharge strategies to accommodate various parasitic capacitances.

Briefly described, and in accordance with one embodiment, the present invention provides a system for measuring a capacitor ($C_{SENj}$) wherein the system precharges a CDAC (23) in a SAR converter (17) to a reference voltage ($V_{AZ}$) and also precharges a first terminal (3-$j$) of the capacitor to another reference voltage (GND). During a measurement phase, the CDAC is coupled between an output and an input of an amplifier (31) and the capacitor also is coupled to the input of the amplifier, so as to redistribute charge between the capacitor and the CDAC. The amplifier generates an output voltage ($V_{AMP}$) that represents the capacitance being measured. The output voltage is stored in the CDAC. The SAR converter converts the output voltage to a digital value representing the capacitance being measured.

In one embodiment, the invention provides a capacitance measurement system (15) including a successive approximation register analog-to-digital conversion circuit (SAR ADC) (17). The SAR ADC includes a comparator (26) and a divider/feedback CDAC (capacitor digital-to-converter) (23) including a plurality of weighted CDAC capacitors (25-0, . . . 25-$k$, . . . 25-$n$) each having a first terminal coupled to a corresponding one of a plurality of conductors (21-0, . . . 21-$k$, . . . 21-$n$), respectively, and each having a second terminal coupled by a first conductor (24) to a first input (+) of the comparator (26). The SAR ADC also includes SAR logic and switch circuitry (28,30) which produces a digital output (DATA) on a digital bus (32). An output of the comparator (26) is coupled to an input of the SAR logic and switch circuitry (28,30). The SAR logic and switch circuitry (28,30) is coupled to control the plurality of conductors (21-0, . . . 21-$k$, . . . 21) during a SAR conversion. A first switch (S6) has a first terminal coupled the first input (+) of the comparator (26). An active network (29) couples a capacitor ($C_{SENj}$ in FIG. 2A (or $C_{SEN}$ in FIG. 2G)) to be measured to the SAR ADC (17). The active network (29) includes a measurement conductor (20) coupled to a first terminal (3-$j$) of the capacitor ($C_{SENj}$) to be measured and an amplifier (31) for performing the function of aiding charge redistribution among the capacitance ($C_{SENj}$) to be measured and the CDAC capacitors (25-0 . . . 25-$k$ . . . 25-$n$) during a measurement phase. The amplifier (31) has a first input (−) coupled to a second terminal of the first switch (S6), a second input (+) coupled to a first reference voltage ($V_{AZ}$), an output (20A) coupled to an amplifier output conductor (20A), and a first switching circuit (S0, . . . S$k$ . . . S$n$) for coupling the amplifier output conductor (20A) to the plurality of conductors (21-0, . . . 21-$k$, . . . 21-$n$) during the measurement phase.

In a described embodiment, second switch (S1$j$) selectively couples the first terminal (3-$j$) of the capacitor ($C_{SENj}$) to be measured to a second reference voltage (GND), and a third switch (S2$j$) selectively couples the first terminal (3-$j$) of the capacitor ($C_{SENj}$) to be measured to the measurement conductor (20). In one embodiment, the capacitor ($C_{SENj}$) to be measured is a cross-coupling capacitor (13 in FIG. 1A) formed by an intersection of first (2-I) and second (3-$j$) conductors of a touch screen panel (13A).

In one embodiment, switches of the first switching circuit (S0 . . . S$k$ . . . S$n$) are closed during a precharge phase to couple the output (20A) of the amplifier (31) to the plurality of conductors (21-0 . . . 21-$k$ . . . 21-$n$) to precharge the CDAC capacitors (25-0 . . . 25-$k$ . . . 25-$n$), respectively. During the precharge phase, the amplifier (31) is connected in a unity gain configuration, wherein the second input (+) of the amplifier (31) is coupled to the first reference voltage (e.g., $V_{AZ}=V_{DD}/2$), and wherein the amplifier (31) operates to precharge both the first conductor (24) and the plurality of conductors (21-0 . . . 21-$k$ . . . 21-$n$) to the first reference voltage ($V_{AZ}=V_{DD}/2$).

In a described embodiment, switches of the first switching circuit (S0 . . . S$k$ . . . S$n$) are open during a precharge phase before the measurement phase to allow a group of switches (S7$k$) in the SAR logic and switch circuitry (28,30) to precharge the plurality of CDAC capacitors (25-0 . . . 25-$k$ . . . 25-$n$) to a first predetermined precharge voltage (e.g., $V_{DD}$). During the precharge phase, the amplifier (31) is connected in a unity gain configuration, wherein the second input (+) of the amplifier (31) is coupled to the first reference voltage ($V_{AZ}=V_{DD}/2$), and wherein the amplifier (31) operates to precharge the first conductor (24) to the first reference voltage ($V_{AZ}=V_{DD}/2$).

In one embodiment, switches of the first switching circuit (S0 ... Sk ... Sn) are closed during the measurement phase to allow redistribution of charges of the capacitor ($C_{SENj}$) to be measured to produce a measurement voltage ($V_{20}$) on the measurement conductor 20, wherein the amplifier (31) produces a corresponding voltage ($V_{AMP}$) on the plurality of conductors (21-0 ... 21-k ... 21-n) in response to the measurement voltage ($V_{20}$).

In one embodiment, the switches of the first switching circuit (S0 ... Sk ... Sn) are open during a conversion phase after the measurement phase to allow the SAR ADC (17) to successively generate bits of the digital output (DATA).

In one embodiment, a pump capacitor ($C_P$) is coupled between the measurement conductor (20) and a predetermined reference voltage (e.g., GND) during the precharge phase before the measurement phase and is coupled between the measurement conductor (20) and another predetermined reference voltage ($V_{DD}$) during the measurement phase.

Figure 2A:
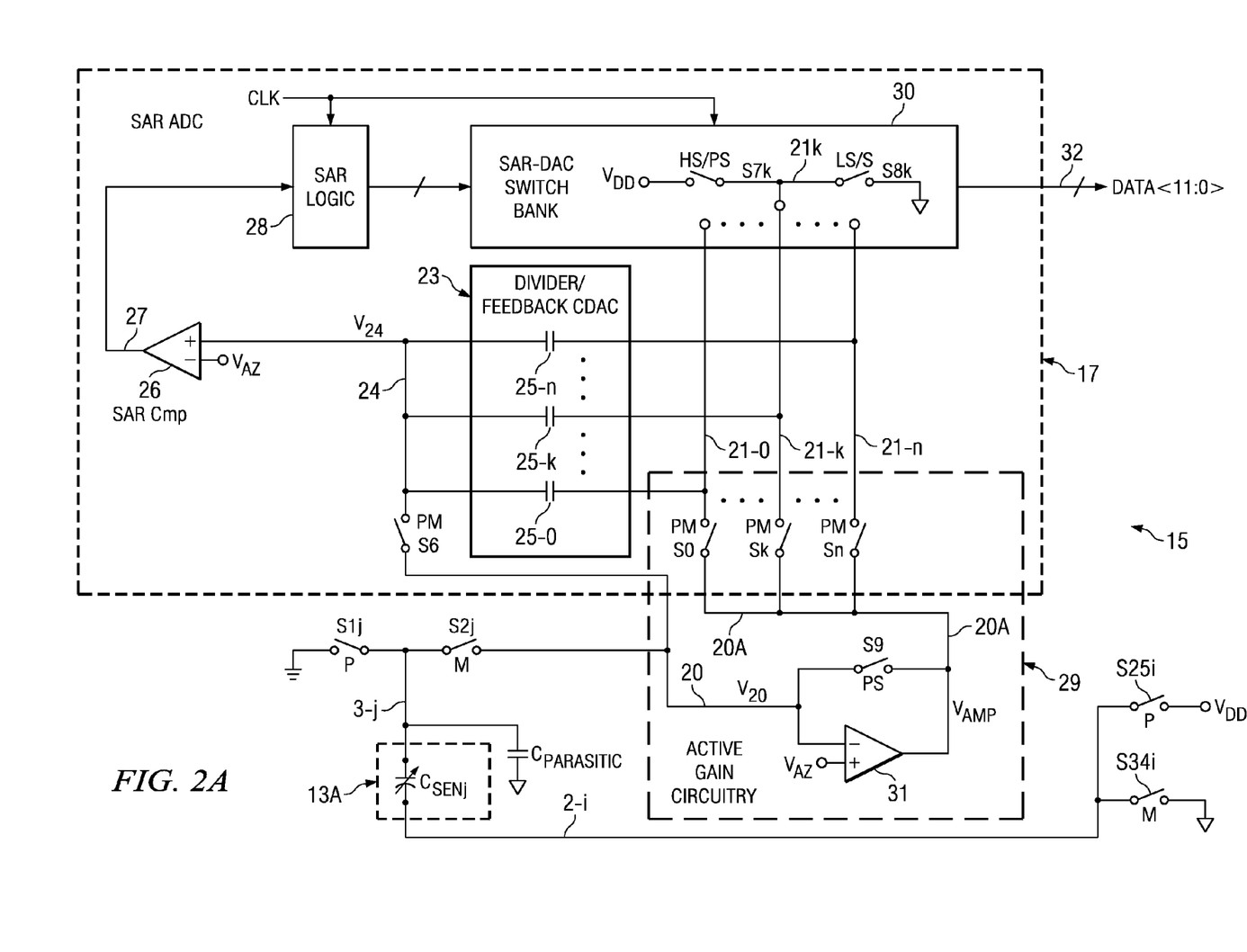
FIG. 2A is a block diagram illustrating an architecture of an embedded SAR based active gain capacitance measurement system of the present invention.

In one embodiment, the invention provides method for measuring a capacitance ($C_{SENj}$ in FIG. 2A ($C_{SEN}$ in FIG. 2G)) of a first capacitor ($C_{SENj}$ in FIG. 2A ($C_{SEN}$ in FIG. 2G)), including precharging first terminals (21-0 ... 21-k ... 21-n) of at least one of a plurality of weighted CDAC capacitors (25-0 ... 25-k ... 25-n), respectively, of a CDAC (capacitor digital-to-analog converter) (23) included in a SAR (successive approximation register) converter (17) to a first reference voltage (e.g., $V_{DD}$ or $V_{DD}/2$) during a precharge phase, and precharging a first terminal (3-j) of the first capacitor ($C_{SENj}$) to a second reference voltage (GND) during the precharge phase, coupling the first terminals (21-0 ... 21-k ... 21-n) of the CDAC capacitors (25-0 ... 25-k ... 25-n) to the first terminal (3-j) of the first capacitor ($C_{SENj}$) to redistribute charges among the first capacitor ($C_{SENj}$ in FIG. 2A ($C_{SEN}$ in FIG. 2G)) and at least some of the plurality of feedback capacitors (25-0 ... 25-k ... 25-n) during a measurement phase after the precharge phase so as to generate a first voltage ($V_{20}$) on a measurement conductor (20), amplifying the first voltage ($V_{20}$) by means of an amplifier (31) having a feedback network including the CDAC (23) to generate a second voltage ($V_{20A}$) on an output (20A) of the amplifier (31) during the measurement phase while coupling at least some of the first terminals (21-0 ... 21-k ... 21-n) of the CDAC capacitors (25-0 ... 25-k ... 25-n) to the second voltage ($V_{20A}$), the first voltage ($V_{20}$) being representative of the capacitance ($C_{SENj}$) of the first capacitor ($C_{SENj}$), and performing a successive approximation conversion operation on the second voltage ($V_{20A}$) during a conversion phase after the measurement phase to generate a digital representation (DATA) of the first capacitance ($C_{SENj}$).

In one embodiment, the method includes closing switches of the first group of switches (S0 ... Sk ... Sn) during the precharge phase to couple the output (20A) of the amplifier (31) to the first terminals (21-0 ... 21-k ... 21-n) of the CDAC capacitors (25-0 ... 25-k ... 25-n) to precharge the CDAC capacitors (25-0 ... 25-k ... 25-n), respectively, wherein during the precharge phase, the amplifier (31) is connected in a unity gain configuration, wherein a first input (+) of the amplifier (31) is coupled to a predetermined reference voltage ($V_{AZ}=V_{DD}/2$). The method includes operating the amplifier (31) to precharge both a second terminal (24) of each of the CDAC capacitors (25-0 ... 25-k ... 25-n) and the plurality of conductors (21-0 ... 21-k ... 21-n) to the predetermined reference voltage ($V_{AZ}=V_{DD}/2$) during the precharge phase.

In one embodiment, the method includes opening switches of the first group of switches (S0 ... Sk ... Sn) during the precharge phase to allow a group of switches (S7k) in the SAR converter (17) to precharge the plurality of CDAC capacitors (25-0 ... 25-k ... 25-n) to a predetermined precharge voltage ($V_{DD}$), wherein the amplifier (31) is connected in a unity gain configuration, and wherein a first input (+) of the amplifier (31) is coupled to the predetermined reference voltage ($V_{AZ}=V_{DD}/2$), the method including operating the amplifier (31) operates to precharge a second terminal (24) of each of the CDAC capacitors (25-0 ... 25-k ... 25-n) to the predetermined reference voltage ($V_{AZ}=V_{DD}/2$).

In one embodiment, the method includes coupling a pump capacitor ($C_P$) between the first terminals (21-0 ... 21-k ... 21-n) of the CDAC capacitors (25-0 ... 25-k ... 25-n) and a predetermined reference voltage (e.g., GND) during the precharge phase and coupling the pump capacitor ($C_P$) between the first terminals (21-0 ... 21-k ... 21-n) of the CDAC capacitors (25-0 ... 25-k ... 25-n) and another predetermined reference voltage (e.g., $V_{DD}$) during the measurement phase to boost a voltage of the first terminals (21-0 ... 21-k ... 21-n) of the CDAC capacitors (25-0 ... 25-k ... 25-n) to compensate for parasitic capacitance.

In one embodiment, the invention provides a capacitance measurement system for measuring a capacitance ($C_{SENj}$ in FIG. 2A ($C_{SEN}$ in FIG. 2G)) of a first capacitor ($C_{SENj}$ in FIG. 2A ($C_{SEN}$ in FIG. 2G)), including means (30) for precharging first terminals (21-0 ... 21-k ... 21-n) of at least one of a plurality of weighted CDAC capacitors (25-0 ... 25-k ... 25-n), respectively, of a CDAC (capacitor digital-to-analog converter) (23) included in a SAR (successive approximation register) converter (17) to a first reference voltage (e.g., $V_{DD}$ or $V_{DD}/2$) during a precharge phase, and precharging a first terminal (3-j) of the first capacitor ($C_{SENj}$) to a second reference voltage (GND) during the precharge phase, means (S0 ... Sk ... Sn) for coupling the first terminals (21-0 ... 21-k ... 21-n) of the CDAC capacitors (25-0 ... 25-k ... 25-n) to a first terminal (3-j) of the first capacitor ($C_{SENj}$) to redistribute charges among the first capacitor ($C_{SENj}$ in FIG. 2A ($C_{SEN}$ in FIG. 2G)) and at least some of the plurality of CDAC capacitors (25-0 ... 25-k ... 25-n) during a measurement phase after the precharge phase so as to generate a first voltage ($V_{20}$) on a measurement conductor (20), amplifying means (31) for amplifying the first voltage ($V_{20}$) having a feedback network including the CDAC (23) to generate a second voltage ($V_{20A}$) on an output (20A) of the amplifier (31) during the measurement phase while coupling at least some of the first terminals (21-0 ... 21-k ... 21-n) of the CDAC capacitors (25-0 ... 25-k ... 25-n) to the second voltage ($V_{20A}$), the first voltage ($V_{20}$) being representative of the capacitance ($C_{SENj}$) of the first capacitor ($C_{SENj}$), and means (17) for performing a successive approximation conversion operation on the second voltage ($V_{20}$) during a conversion phase after the measurement phase to generate a digital representation (DATA) of the first capacitance ($C_{SENj}$).

DETAILED DESCRIPTION

FIG. 2A shows a single-ended (i.e., not differential) embodiment of an embedded SAR based active capacitance measurement system 15 of the present invention which provides more capacitance measurement sensitivity, a wider range of parasitic capacitance, and a wider range of capacitance to be measured than the capacitance measurement system described in the above-mentioned co-pending applications. Capacitance measurement system 15 includes active gain circuitry 29 and a SAR (successive approximation register) type of ADC (analog-to-digital converter) 17. Active gain circuitry 29 is coupled to effectuate measurement of touch screen capacitance $C_{SENj}$, where $C_{SENj}$ can be the cross-coupling capacitance in external touchscreen panel 13A (which can be similar to the touch screen panel shown in Prior Art FIGS. 1A and 1B). Alternatively, the capacitance $C_{SENj}$ can be a capacitance $C_{SEN}$ or $C_{BUTTON}$ of a touch pad or a touch button, rather than a touchscreen panel. In any case, the capacitance $C_{SENj}$ is typically decreased (depending on the particular panel or touch button configuration) by the presence of a human finger in the electric field associated with capacitance $C_{SENj}$. The portion of active capacitance measuring system 15 in FIG. 2A exclusive of touchscreen panel 13A preferably is implemented on a single integrated circuit chip.

Figure 2B:
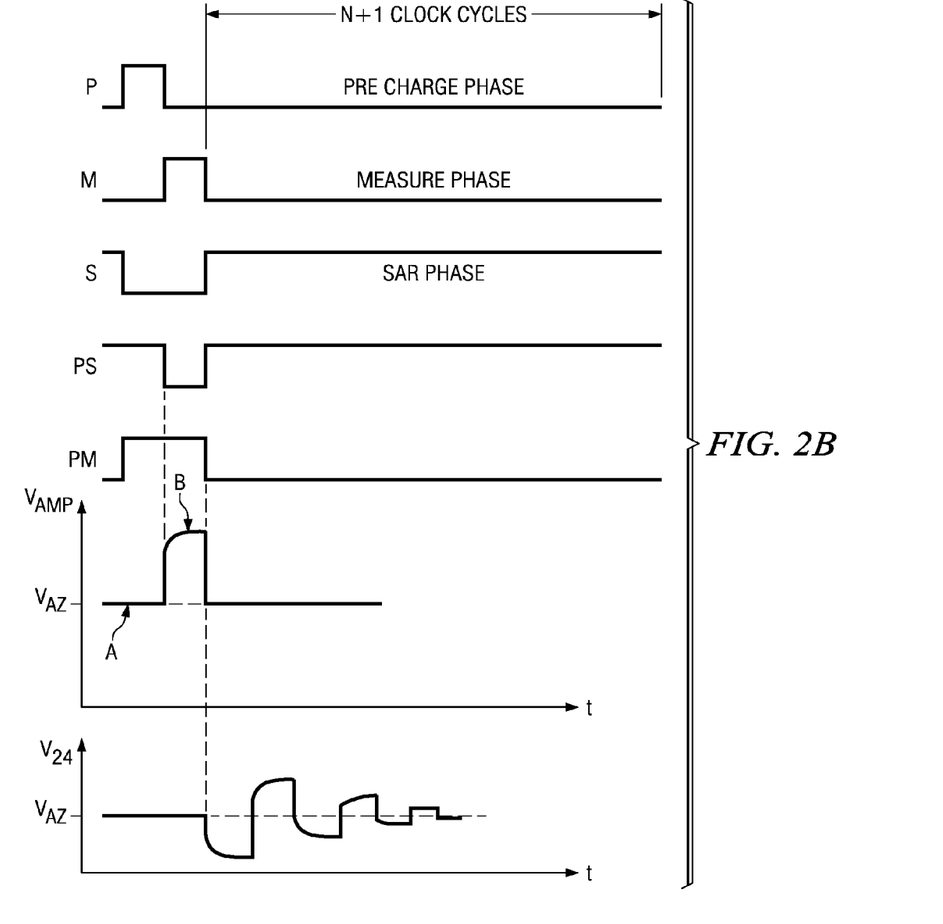
FIG. 2B is a timing diagram of clock signals used to operate the capacitance measurement system of FIG. 2A.

In FIG. 2A, a cross-coupling capacitance $C_{SENj}$ at an intersection between a conductor 3-j and a conductor 2-I of external touch screen panel 13A is illustrated, with conductor 2-I of cross-coupling capacitance $C_{SENj}$ being coupled by a switch S25i to $V_{DD}$ during the subsequently described precharge phase (waveform P in FIG. 2B) and coupled by switch S34i to ground during the subsequently described measurement phase (M in FIG. 2B). The top terminal of capacitance $C_{SENj}$ can be coupled by conductor 3-j and a switch S2j to measurement conductor 20. The value of $C_{SENj}$ is affected by the touch or proximity or movement of a user's finger, depending on how close the finger approaches the intersection of conductors 2-I and 3-j (as in previously described Prior Art FIGS. 1A and 1B) of touchscreen panel 13A or how close the finger approaches the $C_{SEN}$ area of a touch button 13B as shown in FIG. 2G. (The capacitor to be measured also could be a pressure-sensitive capacitor in which a change in the capacitance is caused by pressure of the user's finger on the touch point.) Various parasitic capacitances having a total value $C_{PARASITIC}$ are in effect coupled between conductor 3-j and ground, generally as shown in FIG. 2A.

Touch screen panel 13A and switches S25i and S34i in FIG. 2A can be replaced by the illustrated touch button switch circuit shown in above mentioned FIG. 2G. Referring to FIG. 2G, the touch button switch circuit includes a touch button capacitor 13B having a capacitance $C_{SEN}$, also referred to as $C_{BUTTON}$. The lower terminal of touch button capacitor 13B is connected to a fixed reference voltage, such as ground. The upper terminal of touch button capacitor 13B is coupled by switch S1 to ground during precharge phase P and is coupled by switch S2 to measurement conductor 20 during measurement phase M.

Referring again to FIG. 2A, active gain circuitry 29 includes an operational transconductance amplifier 31 having its (−) input connected to measurement conductor 20. The (+) input of amplifier 31 is connected to an auto-zeroing voltage $V_{AZ}$. A typical value of $V_{AZ}$ would be $V_{DD}/2$. However, $V_{AZ}$ also could be ground or $V_{DD}$ (or any other suitable voltage), depending on how SAR comparator 26 is configured. Amplifier 31 produces an output voltage $V_{AMP}$ on conductor 20A. $V_{AMP}$ conductor 20A is connected to one terminal of a unity gain switch S9, the other terminal of which is connected to measurement conductor 20. Active gain circuitry 29 also includes interface switches S0 . . . Sk . . . Sn, each having a first terminal connected by $V_{AMP}$ conductor 20A. The second terminals of switches S0 . . . Sk . . . Sn are connected to "bottom plate" conductors 21-0 . . . 21-k . . . 21-n, respectively, of a divider/feedback CDAC 23 of SAR ADC 17. Active gain circuitry 29 and SAR ADC circuit 17 are connected/disconnected from each other by interface switches S0, . . . Sk, . . . Sn in response to clock signal PM.

Divider/feedback CDAC (capacitor digital-to-analog converter) 23 in SAR ADC 17 includes a "top plate" conductor 24 connected to one terminal of a switch S6, the other terminal of which is connected to measurement conductor 20. Top plate conductor 24 is also connected to a first terminal of each of binarily weighted CDAC capacitors 25-0 . . . 25-k . . . 25-n. The second terminal of each of CDAC capacitors 25-0 . . . 25-k . . . 25 is connected to a corresponding one of bottom plate conductors 21-0, 1 . . . k . . . n, respectively, of divider/feedback CDAC 23. Divider/feedback CDAC 23 may function in the precharge operation of active gain circuitry 29, always functions in charge redistribution operations of active gain circuitry 29, and always functions in the SAR analog-to-digital conversion of the voltage on $V_{AMP}$ conductor 20A into the digital output signal DATA<11:0>.

Circuit elements which are coupled to the input of SAR DAC 17 on $V_{AMP}$ conductor 20A, including the measured capacitance $C_{SENj}$, the parasitic capacitance $C_{PARASITIC}$, and the charge pump capacitance $C_P$ of subsequently described FIG. 3 if used, can be considered as part of active circuitry 29 (but not also part of SAR DAC 17). Charge redistribution is performed by means of active circuitry 29, which functions much differently than the passive circuitry of the above mentioned co-pending applications. Divider/feedback CDAC 23 may be used by active circuitry 29 during both the precharge operation and the measurement operation or only during the measurement operation. In any case, amplifier 31 is not used during any aspect of the conversion operation of SAR ADC 17. The amplifier 31 in active circuitry 29 allows complete discharge of the capacitance $C_{SENj}$ being measured, whereas $C_{SENj}$ is discharged only to a voltage level resulting from a capacitive voltage division in the above-mentioned co-pending applications.

A typical value of $\Delta C_{SENj}$, which is the change typically produced in the capacitance of capacitor $C_{SENj}$ by the presence of a user's finger touching the capacitor, can be approximately 100 femtofarads. An amount of charge corresponding to $\Delta C_{SENj}$ is transferred to the capacitors of CDAC 23 during the measurement phase. There is a gain/attenuation implicit in the transfer, equal to $(C_{SENj}+C_{PARASITIC})$ divided by the total CDAC capacitance $C_{CDAC}$. The value of the total CDAC capacitance $C_{CDAC}$ may be approximately 13 pF, and the value of $C_{SENj}$ may be approximately 3 or 4 pF. The feedback capacitance across amplifier 31 theoretically could be decreased in order to increase the gain by increasing the value of $\Delta C_{SENj}$, which is due to the presence of the finger performing the touch. However, in an implementation of the invention being developed, the kT/C noise in the system makes it impractical to reduce $C_{CDAC}$ to a value less than 13 pF.

SAR ADC 17 includes an SAR comparator 26 having a (+) input connected to top plate conductor 24 and a (−) input connected to receive auto-zeroing voltage $V_{AZ}$. (Note that ordinarily the input applied to the (−) input of SAR comparator 26 is the analog output of another CDAC which is either being used as a minor circuit or is being used to sample ground via a "dummy" circuit. For example, the (−) input of SAR comparator 26 could be connected to the CDAC output of the capacitance measuring system disclosed in the above-mentioned co-pending applications. Auto-zeroing circuitry for a SAR comparator is conventional, and can be readily implemented by those skilled in the art.) Top plate conductor 24 of divider/feedback CDAC 23, rather than the bottom plate conductors 21-0 . . . 21-k . . . 21-n thereof, preferably is connected to the (+) input of SAR comparator 26 because top plate conductor 24 typically has less parasitic capacitance. The output of SAR comparator 26 is connected by conductor 27 to the input of conventional SAR logic circuitry 28, the output bus of which is connected to the input of a conventional SAR DAC (digital-to-analog converter) switch bank circuit 30. SAR logic circuit 28 and SAR DAC switch bank 30 are clocked by a clock signal CLK.

SAR-DAC switch bank 30 includes the bank of switches S7k and S8k that pulls the bottom plate conductor of any particular CDAC capacitor to either a high level or a low level. Completion of a SAR analog-to-digital conversion results in the final value of DATA<11:0>. SAR logic 28 performs the function of controlling the switches in SAR DAC switch bank 30. Each of bottom plate conductors 21-0 . . . 21-k . . . 21-n is connected to a conductor 21k of a corresponding switching circuit, respectively, in SAR ADC switch bank 30. Each such switching circuit includes a pair of switches S7k and S8k, where k is an index having a value between 0 and n. A first terminal of each of switches S7k and S8k of a "k"th pair has a first terminal connected to conductor 21k. The second terminal of each switch S7k is connected to a suitable first reference voltage (such as supply voltage $V_{DD}$), and the second terminal of each switch S8k is connected to a corresponding suitable second reference voltage (such as ground or $V_{SS}$). The digital output of SAR DAC switch bank 30 is connected to data output bus 32, on which the digital data value DATA<11:0> (for a 12-bit SAR DAC) is produced. DATA<11:0> represents the measured capacitance of $C_{SENj}$.

The HS/PS and LS/S signals in SAR DAC switch bank 30 operate the various switches S7k and S8k, respectively, during the SAR operation. The HS signal (high SAR switch bank signal) has the same timing as the PS signal and the LS signal (low SAR switch bank signal) has the same timing as the S signal in FIG. 2B, and values of HS and LS during the conversion phase are determined by the SAR ADC algorithm being executed. In one of the subsequently explained CDAC precharge strategies, the HS/PS and LS/S signals also operate to precharge the various bottom plate conductors 21-0 . . . 21-k . . . 21-n to either high or low voltages, respectively, according to the particular precharge strategy objective.

Figure 2C:
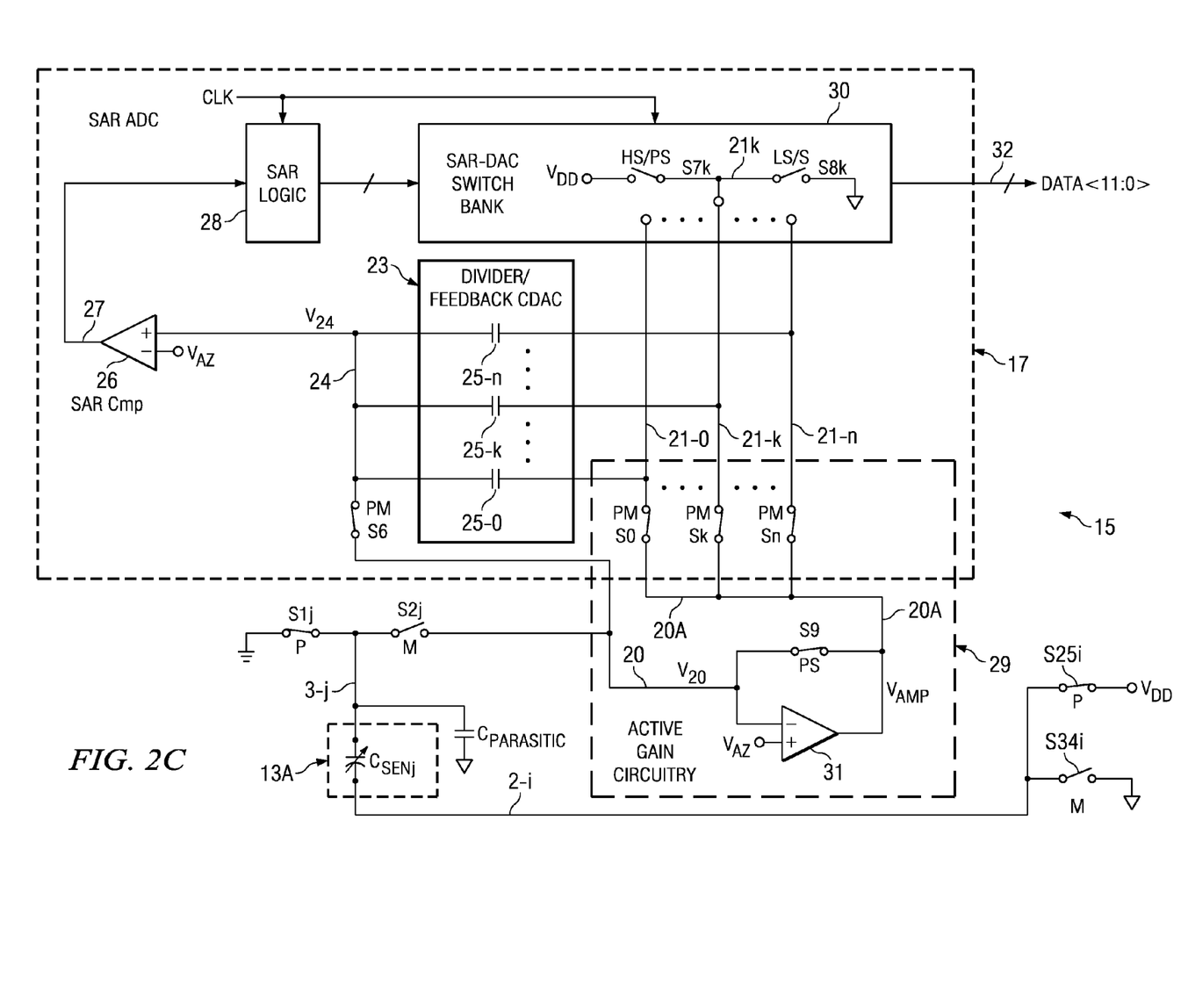
FIG. 2C is a block diagram useful in explaining operation of one precharge strategy in the capacitance measuring system of FIG. 2A during a precharge phase.
Figure 2D:
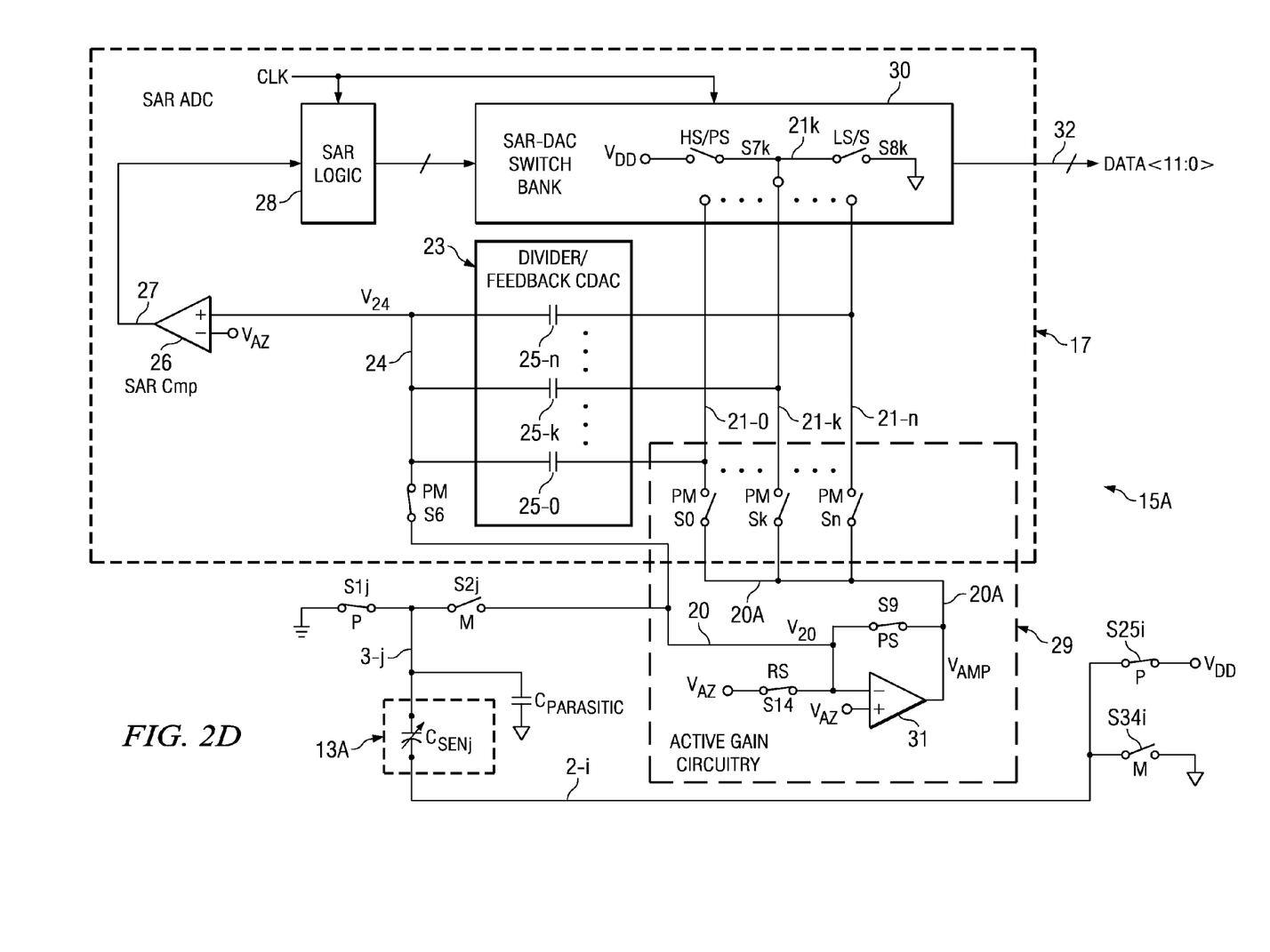
FIG. 2D is a block diagram useful in explaining operation of another precharge strategy in the capacitance measuring system of FIG. 2A during a precharge phase.

Subsequently described FIG. 2C shows amplifier 31 in its unity gain configuration, i.e., with switch S9 closed, with CDAC 23 coupled between the amplifier output $V_{AMP}$ on conductor 20A and the (−) input of amplifier 31. If the precharge strategy illustrated in subsequently explained FIG. 2D is being used, then appropriate values of HS and LS are used during the precharge phase to control the precharging of the various CDAC capacitors, respectively, in accordance with the particular precharge strategy being used.

As indicated above, there are a number of choices or strategies for precharging the various CDAC capacitors and measurement capacitor $C_{SENj}$ during the precharge phase. For example, one precharge strategy would be to close switches S0 . . . Sk . . . Sn during the precharge phase to connect the bottom plate conductors 21-0 . . . 21-k . . . 21-n to the amplifier output voltage $V_{AMP}$ while applying $V_{AZ}$ to top plate conductor 24, so as to precharge CDAC capacitors 25-0 . . . 25-k . . . 25-n during the precharge phase. In this case, S7k and S8k are not active during precharge. This precharge strategy is illustrated in subsequently described FIG. 2C.

Another precharge strategy would be to open switches S0 . . . Sk . . . Sn during the precharge phase to isolate bottom plate conductors 21-0 . . . 21-k . . . 21-n from $V_{AMP}$, and instead operate switches Sk7 and Sk8 in switch bank 32 selectively precharge the various bottom plate conductors 21-0 . . . 21-k . . . 21-n while also forcing top plate conductor 24 to $V_{AZ}$ by means of a unity feedback configuration of amplifier 31 through switch S9. SAR-DAC switches in block 30 would drive the various bottom plate conductors 21-0 . . . 21-k . . . 21-n of any or all of CDAC capacitors 25-0 . . . 25-k . . . 25-n, respectively, to either $V_{DD}$ or to ground. This would provide an "offset" of sorts that would allow or compensate for different values of voltages that may appear on $V_{AMP}$ conductor 20A at the end of the measurement phase M (FIG. 2B). This precharge strategy is illustrated in subsequently described FIG. 2D.

In yet another precharge strategy, all of the CDAC capacitors can be precharged to $V_{DD}$ and the $C_{SENj}$ capacitor can be precharged to ground. Alternatively, it would be possible to precharge only some of the CDAC capacitors, or even just the MSB CDAC capacitor, to $V_{DD}$ and precharge all of the other CDAC capacitors to ground. Or, all of the CDAC capacitors could be precharged to ground and the capacitor $C_{SENj}$ to could be precharged to $V_{DD}$. It should be appreciated that the voltage applied to top plate conductor 24 can have any suitable voltage and can be applied in any suitable manner, and is not limited to $V_{AZ}$ as illustrated in FIG. 2A. The benefit of such different precharging strategies would be to achieve different advantageous voltages on $V_{AMP}$ conductor 20A resulting from the charge redistribution during the measurement phase.

Note, however, that the above mentioned "suitable" corresponding reference voltages could be set to a value higher than $V_{DD}$ and a value lower than ground, respectively, or alternatively they could be set to a value less than $V_{DD}$ and a value higher than ground, respectively, in order to "squeeze" or "expand" the usable input range of SAR ADC 17. (Various implementations of SAR ADCs that execute the well known basic SAR algorithm are widely used, and can be readily implemented by those skilled in the art. For example, the assignee's TSC2007, TSC2005, TSC2003, TSC2046, ADS7846 all include similar SAR ADC circuits which could be used.)

The circuitry including amplifier 31, switches S1$j$, and S9, and SAR ADC 17 is basically a transconductance amplifier with an embedded SAR ADC converter. It should be appreciated that the methodology for charge transfer and measurement of the capacitance $C_{SENj}$ or $C_{SEN}$ in accordance with the present invention is substantially different than for the above-mentioned co-pending applications.

Above-mentioned FIG. 2B is a timing diagram including the digital signal P which represents the precharge phase of active gain capacitance measurement system 15, the digital signal M which represents the measurement phase, and a digital signal S which represents an SAR analog-to-digital conversion phase. Timing diagram FIG. 2B also shows a digital signal PS which is the inverse of the signal M and a digital signal PM which is the inverse of the signal S. Switch S1$j$ is controlled by precharge phase signal P. Switches S2$j$ and S0 . . . Sk . . . Sn are controlled by measurement phase signal M. Switch S6 is controlled by clock signal PM, switches S7$k$ are controlled by clock signal PS, and switches S8$k$ are controlled by SAR phase clock S, where k has all of the values between 0 and n. The waveforms of the amplifier output $V_{AMP}$ and the voltage $V_{24}$ on top plate conductor 24 also are shown. (Note that all of the switches in FIG. 2A are illustrated in their "open" condition.)

FIG. 2C shows the configuration of the various switches of active gain capacitance measurement system 15 of FIG. 2A during the above mentioned precharge phase for the above mentioned precharge strategy wherein amplifier 31 is used to precharge the bottom plate conductors 21-0 . . . 21-$k$ . . . 21-$n$ and wherein switches S7$k$ and S8$k$ of switch bank 30 are open and inactive. During precharge phase P, switches S1$j$, S6, S9, and S25$i$ are closed. Switches S0 . . . Sk . . . Sn also are closed. Switch S2$j$ and all of switches S7$k$ and S8$k$ are open. In this configuration, the touchscreen capacitance $C_{SENj}$ (or touch button capacitance $C_{SEN}$ of FIG. 2G) being measured is discharged to ground through switch S1$j$. Since unity-gain switch S9 is closed, the voltage $V_{20}$ of measurement conductor 20 is equal to the amplifier output voltage $V_{AMP}$ on conductor 20A.

Since switch S6 is closed, amplifier 31 operates to precharge top plate conductor 24 of divider/feedback CDAC 23 to $V_{AZ}$ (which may be equal to $V_{DD}/2$) prior to the measurement phase (wherein charge redistribution occurs between $C_{SENj}$ and the capacitors of divider/feedback CDAC 23.) Since amplifier 31 is set in its unity gain configuration and CDAC 23 is coupled as a feedback network between the output 20A and (−) input of amplifier 31, the bottom plate conductors 21-0 . . . 21-$k$ . . . 21-$n$ capacitors of divider/feedback CDAC 23 also are precharged to $V_{AZ}$, so CDAC 23 is precharged to a value of 0 volts during the precharge phase.

FIG. 2D shows a configuration of the various switches of active gain capacitance measurement system 15A the same as or similar to the system shown in FIG. 2A during the precharge phase for the above mentioned precharge strategy wherein interface switches S0 . . . Sk . . . Sn are open and amplifier 31 is used only to precharge top plate conductor 20. Switches S1$j$, S6, S9, and S25$i$ are closed. Switch S2$j$ is open. The touchscreen capacitance $C_{SENj}$ being measured is discharged to ground through switch S1$j$. Since unity-gain switch S9 is closed, the voltage of measurement conductor 20 is equal to $V_{AZ}$. (Note that some of bottom plate conductors 21-0 . . . 21-$k$ . . . 21-$n$ of CDAC capacitors 25-0 . . . 25-$k$ . . . 25-$n$ could be coupled to the amplifier output voltage $V_{AMP}$ or could be precharged in various ways to $V_{DD}$ or ground.)

Still referring to FIG. 2D, amplifier 31 can be connected in its unity gain configuration, with switch S9 closed and operated to equalize the voltages of its (−) and (+) inputs to thereby precharge top plate conductor 24. (Alternatively, amplifier 31 can be completely decoupled from CDAC 23 and CDAC capacitors 25-0 . . . 25-$k$ . . . 25-$n$ can be precharged in any suitable manner to values which are suitable to the precharge strategy being used.) Switches S7$k$ and S8$k$ of switch bank 30 in FIG. 2D are used during the precharge phase to selectively precharge various bottom plate conductors 21-0 . . . 21-$k$ . . . 21-$n$ so as to accomplish a specific objective of the precharge strategy. (Alternatively, a PS-controlled switch S14 could be coupled between auto-zero voltage $V_{AZ}$ and the (−) input of amplifier 31 to precharge the top plate conductor 24 during the precharge phase if amplifier 31 is powered down during the precharge phase. It should be understood that both CDAC 23 and $C_{SENj}$ could be precharged in many different ways, for example by means of a variable voltage source, another capacitor, or a charge pump.)

For the precharge strategy being used in FIG. 2D, some or all of the n+1 switches S7$k$ (depending on the precharge objective) may be closed during the precharge phase. Consequently, first terminals of some or all of CDAC capacitors 25-0 . . . 25-$k$ . . . 25-$n$ in divider/feedback CDAC circuit 23 are connected to $V_{DD}$ through their corresponding switches S7$k$, respectively, while the interface switches S0 . . . Sk . . . Sn remain closed, in order to precharge the corresponding bottom plate conductors 21-0 . . . 21-$k$ . . . 21-$n$ of divider/feedback CDAC circuit 23. The capacitance $C_{SENj}$ is discharged and the bottom plates of capacitors 25-0 . . . 25-$k$ . . . 25-$n$ of divider/feedback CDAC circuit 23 are precharged to a suitable reference voltage level, such as $V_{DD}$ (or a voltage generated by a variable gain amplifier circuit or a charge pump circuit).

Another possible precharge strategy would be to leave the charge from a previous measurement phase on at least some of CDAC capacitors during a present precharge phase and not perform an additional precharge operation during the present precharge phase. The voltage stored across those CDAC capacitors at the end of each measurement phase becomes the reference for the next measurement phase without an intervening precharging of those CDAC capacitors.

By way of definition, the term "precharge" as used herein, during any precharge phase, includes "precharging" at least some of the CDAC capacitors during the previous measurement phase simply by leaving the results of that measurement phase on those CDAC capacitors.

Figure 2E:
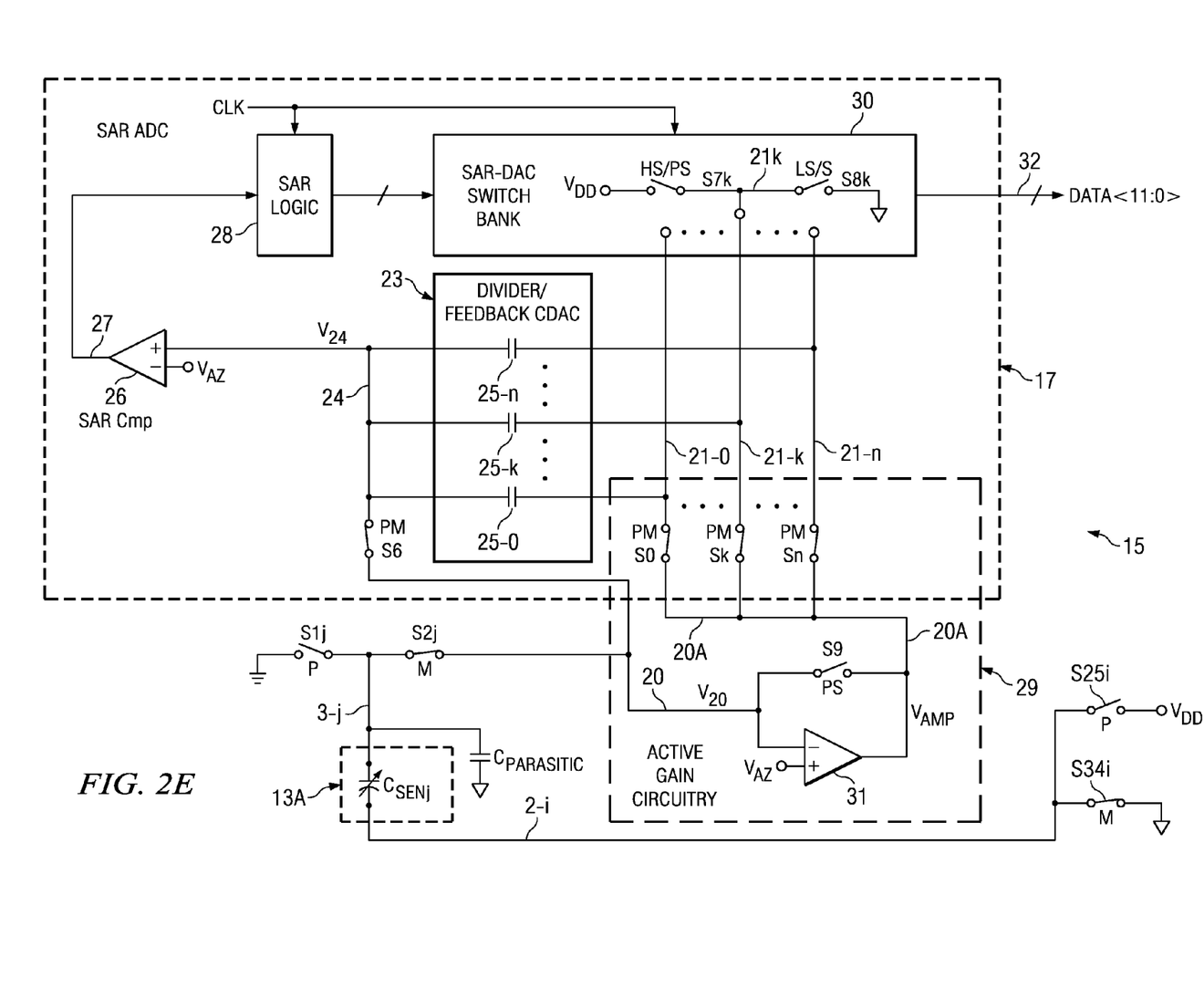
FIG. 2E is a block diagram useful in explaining operation of the capacitance measuring system of FIG. 2A during a measurement phase.

FIG. 2E shows the configuration of the various switches of capacitance measurement system 15 of FIG. 2A during the measurement phase, while clock signal M is at its high level as indicated in FIG. 2B. Switches S2$j$, S6, and S34$i$ are closed. Switches S0 . . . Sk . . . Sn usually are closed, although in some cases one or more of switches S0 . . . Sk . . . Sn may be open to allow use of SAR banks switches S7$k$ and S8$k$ to configure the amount of CDAC capacitance to be involved in the charge transfer process (k being the above mentioned index variable having values between 0 and n). Some or all of the bottom plate conductors 21-0 . . . 21-$k$ . . . 21-$n$ of divider/feedback CDAC 23 (depending on the precharge strategy being used) have been precharged through some or all of switches S7$k$ to a suitable reference voltage, for example, $V_{DD}$, and then disconnected therefrom. With interface switches S0 . . . Sk . . . Sn closed, and connecting amplifier output conductor 20A to bottom plate conductors 21-0 . . . 21-$k$ . . . 21-$n$ of divider/feedback CDAC 23, the charges produced during the precharge phase on $C_{SENj}$ and at least some of CDAC capacitors 25-0 . . . 25-$k$ . . . 25-$n$ are redistributed among the various capacitors that are connected together. The charge redistribution causes a corresponding change in the voltage $V_{20}$ on measurement conductor 20. Amplifier 31 operates to equalize the voltages on its (−) and (+) inputs, thereby producing a corresponding change in $V_{AMP}$ and hence on CDAC bottom plate conductors 21-0 . . . 21-$k$ . . . 21-$n$. Since switch S9 is open, amplifier 31 generates a value of $V_{AMP}$ which is proportional to the ratio of the capacitance ($C_{SENj}$+$C_{PARASITIC}$) divided by the total $C_t$ of the CDAC capacitances. (Note that although the auto-zeroing operation continues so that at this point the voltage on the (+) input of SAR comparator 26 has not changed, the auto-zeroing of SAR comparator 26 does not necessarily have to continue during the capacitance measurement phase. Auto-zeroing is not even essential to all embodiments of the present invention.)

It should be appreciated that, depending on the expected value of $C_{SENj}$, it might be desirable to not connect all of the CDAC capacitors into the foregoing capacitive divider configuration during the measurement phase. For example, only the MSB CDAC capacitor might be included in the divider configuration. Alternatively, the bottom plate conductors 21-0 . . . 21-$k$ . . . 21-$n$ being referred to could have been precharged to some other suitable reference voltage between $V_{DD}$ and ground. For example, the CDAC bottom plate conductors 21-0 . . . 21-$k$ . . . 21-$n$ could have been precharged to zero and $C_{SENj}$ could be precharged to $V_{DD}$ for the measurement phase, again depending on the precharging strategy being used. This might even be necessary, depending on the needed ratio of the total CDAC capacitances and $C_{SENj}$ (plus its associated parasitic capacitance $C_{PARASITIC}$).

Thus, during measurement phase M, some or all of CDAC capacitors 25-0 . . . 25-$k$ . . . 25-$n$ are used in a capacitive divider charge transfer configuration. Since $C_{SENj}$ is connected in series with the CDAC capacitance $C_{CDAC}$ which is equal to the total capacitance of some or all of CDAC capacitors 25-0 . . . 25-$k$ . . . 25, the charge redistribution results in a voltage which appears on $V_{AMP}$ conductor 20A, since during the measurement phase the voltage of top plate conductor 24 is fixed at $V_{DD}$/2. The voltage $V_{AMP}$ produced by amplifier 31 is dependent on the precharge voltages previously applied to CDAC 32 and to $C_{SENj}$ plus its associated parasitic capacitance $C_{PARASITIC}$. For example, during the measurement phase, the bottom terminal of $C_{SENj}$ (plus its associated parasitic capacitance $C_{PARASITIC}$) is grounded, and conductor 3-$j$ is connected to conductor 20. The unity-gain switch S9 is open. Conductor 20A is connected to all of the CDAC bottom plate conductors 21-0 . . . 21-$k$ . . . 21-$n$. Amplifier 31 operates so as to cause $V_{20}$ to be equal to $V_{AZ}$. (Since no current can flow into amplifier 31, the only way that can happen is for amplifier 31 to cause charge to flow through CDAC 23. Whatever current flows through CDAC 23 also has to flow through $C_{SENj}$ (plus its associated parasitic capacitance $C_{PARASITIC}$). Even though the result depends on the voltages to which $C_{SENj}$ and CDAC 23 were precharged, amplifier 31 produces whatever value of $V_{AMP}$ is necessary to cause $V_{20}$ to be equal to $V_{AZ}$.)

Then $V_{AMP}$ conductor 20A is disconnected from bottom plate conductors 21-0 . . . 21-$k$ . . . 21-$n$ by interface switches S0 . . . S$k$ . . . S$n$. The SAR conversion operation than can begin. (During the SAR operation, amplifier 31 is either in its unity gain configuration, waiting for the next precharge/measurement sequence, powered down, or in open loop configuration. Amplifier 31 is inactive during the SAR phase. The voltage on conductor 24 is provided as an input to comparator 26 and varies according to the SAR algorithm.)

The use of active amplifier 31 and its feedback network including divider/feedback CDAC 23 in accordance with the present invention results in higher capacitance measurement sensitivity, in measured capacitance per LSB, than is the case for the passive capacitance measuring system of the above-mentioned co-pending applications, mainly because in the present invention, the voltage error or difference between the 2 capacitances is measured, rather than using only a capacitive voltage divider for the capacitive voltage measurement.

Figure 2F:
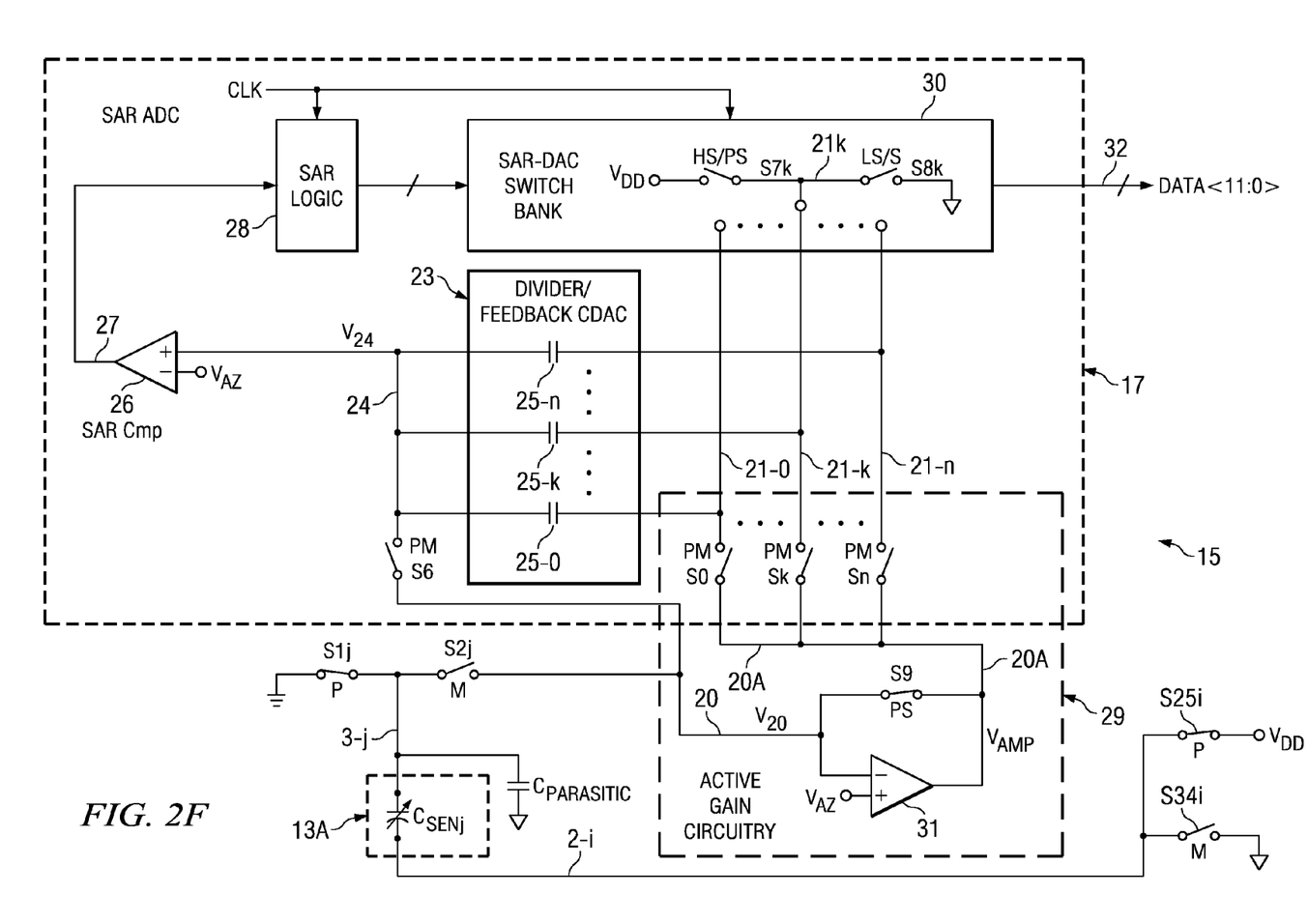
FIG. 2F is a block diagram useful in explaining operation of the capacitance measuring system of FIG. 2A during a SAR analog-to-digital conversion phase.
Figure 2G:
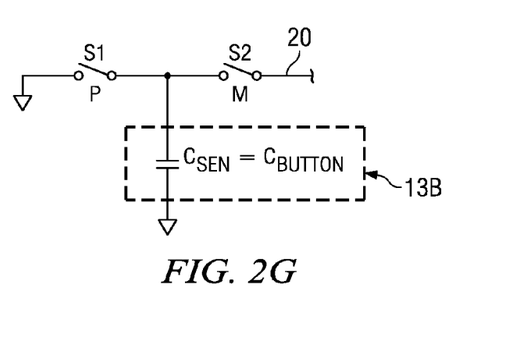
FIG. 2G is a simplified schematic diagram of a touch button circuit which can be connected to measurement conductor 20 in FIG. 2A instead of touch screen panel 13A.

FIG. 2F shows the configuration of various switches of active gain capacitance measurement system 15 of FIG. 2A during the SAR analog-to-digital conversion phase, when clock signals S and PS are at a high level and clock signals P, M, and PM are at a low level as indicated in FIG. 2B. (The signals HS and LS have the same timing as signals PS and S, respectively, but have varying high or low values determined by the SAR ADC algorithm being executed.) During the SAR analog-to-digital conversion phase, switches S1$j$,S9, and S25$i$ are closed and switches S2$j$, S6, S0 . . . S$k$ . . . S$n$, and S34$i$ remain open. Switches S7$k$ and S8$k$ are controlled by SAR logic 28 in accordance with the previously mentioned SAR conversion algorithm so as to cause SAR comparator 26 to test, bit by bit, the voltages produced on top plate conductor 24 as the bottom plates of the CDAC capacitors 25-0 . . . 25-$k$ . . . 25-$n$, starting with the voltage on MSB CDAC capacitor 25-0, are sequentially connected to $V_{DD}$. The bottom conductors of the other CDAC capacitors are connected to ground through their corresponding switches S8$k$. Top plate conductor 24 therefore "floats" according to the actions of SAR DAC switch bank 30 until correct settings of S7$k$ and S8$k$ are achieved so as to cause the voltage of top conductor 24 to become equal to $V_{AZ}$, at which point the settings of S7$k$ and S8$k$ represent the correct digital value DATA.

At the end of the measurement phase, the charge redistribution of the previously described measurement phase operation is complete, so the SAR conversion phase can begin. For the 12-bit case in which n=11, switches S0 . . . S$k$ . . . S11 and switch S6 are opened, at which point the "sampling" of $C_{SENj}$ by active gain circuitry 29 has been completed. SAR DAC switch bank 30 contains a total of 24 switches, in pairs. The bottom plate conductor of each CDAC capacitor, for example, the MSB CDAC capacitor 25-0), can either be pulled to $V_{DD}$ by a corresponding one of switches S7$k$, or it can be pulled to ground by a corresponding one of switches S8$k$ of the same pair. (Of course, the two corresponding switches of a "k"th pair are never simultaneously asserted, i.e., one is never coupled to $V_{DD}$ while the other is coupled to ground.) For example, during the SAR conversion phase, the bottom plate of MSB capacitor 25-0 first is pulled to $V_{DD}$ by switch S7-0 (i.e., switch S7$k$ where k=0) and all of the other less significant CDAC capacitors are pulled to ground by the appropriate S8$k$ switches, and then top plate conductor 24 is compared to V. If testing of the resulting voltage on top plate conductor 24 by SAR comparator 26 determines that the voltage on top plate conductor 24 is too high, then the bottom plate conductor of the corresponding MSB capacitor is pulled to ground by switch S8-0 (i.e., switch S8$k$ where k=0), and the bottom plate conductors of all of the other less significant CDAC capacitors are pulled to $V_{DD}$ by the appropriate S7$k$ switches. Then the next-most-significant (MSB-1) capacitor 25-1 is pulled to $V_{DD}$ and the voltage on top plate conductor 24 is tested, and so forth. Essentially the same procedure is successively repeated for all of the less significant bits.

Execution of the SAR ADC algorithm results in the digital output DATA<11:0>, which indicates the amount of charge redistributed due to a person's finger touching or being in the vicinity of touch point 13 (see FIG. 1A) of touchscreen panel 13A. Once the SAR conversion is complete, the 12 bits of data generated by SAR DAC control circuit 30 represent the value of the voltage on $V_{AMP}$ conductor 20A immediately after the charge redistribution is complete. In a touchscreen controller, the digital output data DATA<11:0> can be readily used to determine the location of the particular touch point 13 on touchscreen panel 13A that has been touched by the finger of a user.

At this point, it may be helpful to provide a simplified example of the operation of capacitance measurement system 15 of FIG. 2A. For convenience, this example assumes that the precharge strategy illustrated in FIG. 2C is being used during the precharge phase. During the precharge phase, switches S0 ... Sk ... Sn are all closed, so amplifier output voltage $V_{AMP}$ is applied to bottom plate conductors 21-0 ... 21-k ... 21-n. Unity-gain switch S9 is closed, so amplifier 31 keeps its (−) input and its output $V_{AMP}$ at the voltage of its (+) input, i.e., at $V_{AZ}=V_{DD}/2$ in this example. Therefore, bottom plate conductors 21-0 ... 21-k ... 21-n and top plate conductor 24 are precharged to $V_{DD}/2$. That is, CDAC capacitors 25-0 ... 25-k ... 25-n are precharged to zero volts. Switch S1j is closed and therefore precharges capacitor $C_{SENj}$ to zero volts. This operation results in level "A" of the $V_{AMP}$ waveform in FIG. 2B. (Note that SAR-DAC switch bank 30 is inactive during the precharge phase for this particular precharge strategy, although numerous other precharge strategies could be used, some including precharging the bottom plates of some or all of the CDAC capacitors.)

Referring to FIG. 2E, the interface switches S0 ... Sk ... Sn in this simplified example are closed during the measurement phase. Switches S6, S2j, and S34i also are closed. Unity-gain switch S9, S1j, and switch S25i are open. Capacitor $C_{SENj}$ has been precharged as described above, and is connected by switch S2j to the (−) input of amplifier 31 and also is connected through switch S6 to top plate conductor 24. Therefore, the charge redistribution transfer occurs between conductor 3-j of capacitor $C_{SENj}$ and top plate conductor 24 of CDAC 23. The charge redistribution causes a change in the voltage $V_{20}$ on the (−) input of amplifier 31, which operates to equalize the voltages on its (−) and (+) inputs and thereby causes a corresponding voltage change on conductor 20A. This voltage change is applied by closed switches S0 ... Sk ... Sn to all of bottom plate conductors 21-0 ... 21-k ... 21-n of CDAC 23. Because of the operation of amplifier 31, the voltage on amplifier output conductor 20A, which corresponds to the level B in the $V_{AMP}$ waveform in FIG. 2B, is equal to the voltage $V_{20}$ on conductor 20 multiplied by the ratio $(C_{SENj}+C_{PARASITIC})/C_{CDAC}$. The voltage difference between conductors 20 and 20A is stored across CDAC capacitors 25-0 ... 25-k ... 25-n.

Referring to FIG. 2F, during the SAR conversion phase of this simplified example, the interface switches S0 ... Sk ... Sn are open, isolating bottom plate conductors 21-0 ... 21-k ... 21-n from amplifier 31. Switches S2j and S34i also are open. Switches S1j, S9, and S25i are closed. The SAR-DAC switches in block 30 operate according to the previously mentioned SAR conversion algorithm so as to search for and determine the combination of values of switch control signals HS and LS that cause the voltage on top plate conductor 24 to equal $V_{AZ}=V_{DD}/2$. The top plate voltage waveform $V_{24}$ in FIG. 2B shows how the voltage of top plate conductor approaches $V_{AZ}$ as the successive approximation process proceeds. The combination of digital values of HS and LS which makes this happen represents the digital output value DATA.

Thus, the present invention provides a switched capacitor network including transconductance amplifier 31, various switches, and CDAC 23 by using the CDAC in the feedback loop of the transconductance amplifier so that part of the time the CDAC functions as a feedback network and the other part of the time it is functions as a CDAC in a SAR ADC converter. This structure and technique saves a substantial amount of area on the integrated circuit chip by using the same CDAC capacitors both for performing a charge redistribution capacitance measurement and performing a SAR analog to digital conversion.

Figure 3:
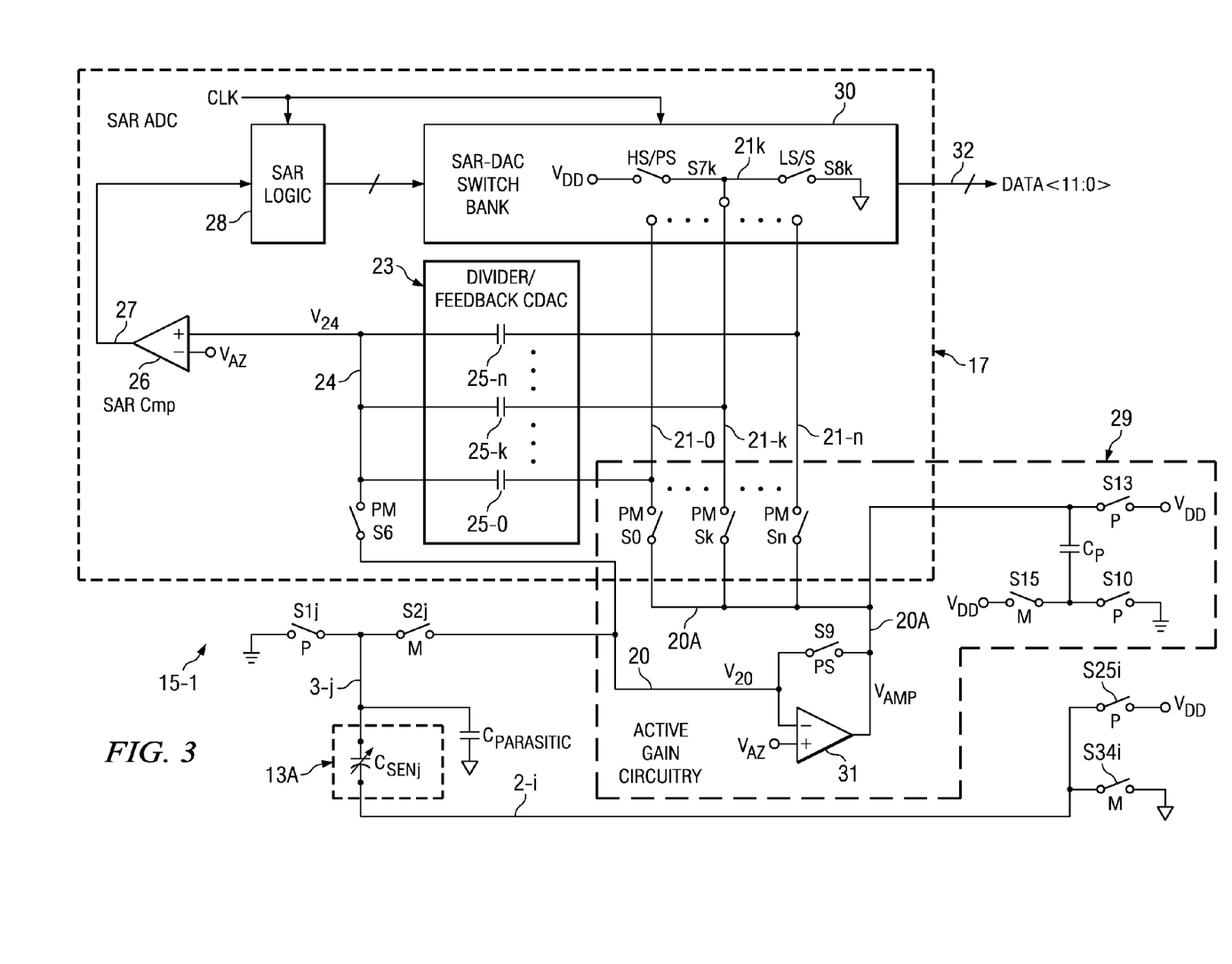
FIG. 3 is a block diagram illustrating a charge pump enhanced embedded SAR based active gain capacitance measurement system of the present invention.

FIG. 3 shows an embedded SAR based active gain capacitance measurement system 15-1 which includes the circuitry shown in FIG. 2A and further includes a charge pump network including a pump capacitor $C_P$ having one terminal connected either directly or by a M-controlled switch (not shown) to $V_{AMP}$ conductor 20A and another terminal connected by conductor 22 to one terminal of each of switches S15 and S10. A P-controlled switch S13 is coupled between measurement conductor 20 and $V_{DD}$. The other terminal of M-controlled switch S15 is connected to $V_{DD}$, and the other terminal of P-controlled switch S10 is connected to ground. During the previously described precharge phase P, pump capacitor $C_P$ is discharged through switch S10 to ground. During the previously described measurement phase, pump capacitor $C_p$ is coupled to $V_{DD}$, thereby "pumping" the voltage on $V_{AMP}$ conductor 20A to a significantly higher voltage than $V_{DD}$ before the previously described charge redistribution occurs. It should be understood that any parasitic capacitance coupled to conductor 3-j is involved in the above described charge redistribution process. Amplifier 31 may saturate if the charge transfer current is too high during the measurement phase. Charge pump capacitor $C_P$ and its associated switches shown in FIG. 3 function to generate an offset voltage to prevent amplifier 31 from saturating.

Figure 4:
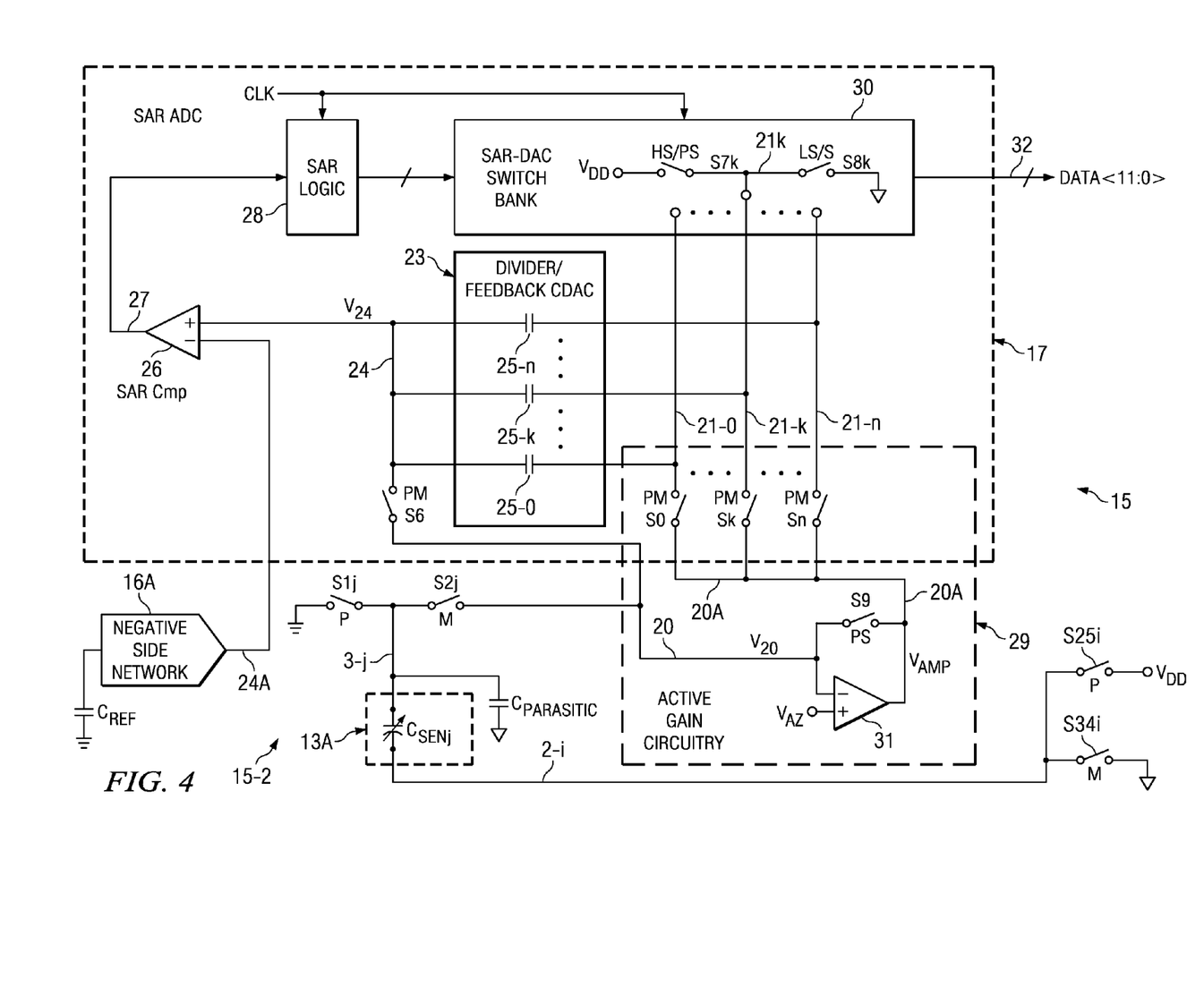
FIG. 4 is a block diagram of a differential implementation of the capacitance measurement system of FIG. 2A.

FIG. 4 shows an active gain capacitance measurement system 15-2 which includes all of the circuitry 15 shown in FIG. 2A, and further includes a "negative side network" 16A and a reference capacitor $C_{REF}$. Negative side network 16A together with reference capacitor $C_{REF}$ may constitute a network 15 that is very similar to the network including active gain circuitry 29 and capacitance $C_{SENj}$. The output 24A of negative side network 16A is connected to the (−) input of SAR comparator 26. The capacitance of reference capacitor $C_{REF}$ can be essentially the same as $C_{SENj}$, and negative side network 16A can be operated simultaneously with the network 15 such that corresponding parasitic-based switching offset voltages are canceled and such that the charge injection in each of the two networks 15 and 16A is common mode and therefore is canceled.

Although negative side network 16A can be considered to be a "dummy" network to achieve the foregoing cancellations, it also can be used to compare $C_{SENj}$ to $C_{REF}$. For example, if one of $C_{SENj}$ and $C_{REF}$ is larger than the other, then the digital output DATA<11:0> is either larger or smaller than its midrange value. A single clock SAR operation can be performed to determine which is larger, and then the rest of the SAR ADC conversion process can be completed to determine the magnitude of the difference between $C_{SENj}$ and $C_{REF}$.

An advantage of the above described embodiments of the invention is improved capacitance measurement sensitivity, due to the active feedback nature of amplifier 31 along with the switched capacitor configuration as implemented during the measurement phase. This capacitance measurement technique is faster than the timer/counter technique used in the prior art. Another advantage of the invention is that the described embodiments of the invention permit a wider range of parasitic capacitance coupled to measurement conductor 20. Furthermore, the described embodiments of the invention have the advantage of allowing a number of different precharge strategies which allow compensating for different levels of parasitic capacitance.

The described embodiments of the invention provide consistent times to generate DATA<11:0> for a sample capacitance measurement, in contrast to the prior art in which the amount of time required for capacitance measurement is quite dependent on the amount of the capacitance to be measured. Less noise is introduced into the described embodiments of the invention because, for example, in a 12 bit SAR ADC implementation the touch screen panel is sampled only once, for 2 μs (microseconds), during each 15 μs cycle time and then is effectively disconnected by opening switches S0 . . . Sk . . . Sn. Only about 15 clock cycles, i.e., 50 μs at 1 MHZ, is required for a capacitance measurement, which is many fewer clock cycles than for the prior art. Since $C_{SENj}$ is only coupled to SAR ADC 17 for only a small fraction of the total cycle operation and then is disconnected, SAR ADC 17 is not affected as much by circuit noise as the prior art, in which the capacitance to be sampled is connected for the entire measurement cycle. The architecture is easily multiplexed for multiple channels, e.g. 8 channels per network. The described embodiments of the invention are easily reconfigurable to allow them to be used as a typical analog-to-digital converter. The capacitance measurement circuit of the present invention therefore can be utilized both as a touch-screen controller and as a fully functional analog-to-digital converter.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the CDAC capacitors in divider/feedback CDAC 23 do not have to be weighted binarily. Furthermore, various known capacitive divider arrangements other than the one illustrated can be used, for example to provide cancellation of common mode errors due to mismatching of circuit elements and mismatching of parasitic elements. It should be appreciated that although the CDAC capacitors are binarily weighted in the described embodiments, they could be weighted in other ways.

The invention claimed is:

1. An apparatus comprising:
   a capacitive touch screen panel;
   an active gain control circuit having:
      an amplifier that is coupled to the capacitive touch screen panel;
      a switch that is coupled to the capacitive touch screen panel; and
      a first switching circuit that is coupled to the amplifier and the switch;
   a successive approximation register (SAR) analog-to-digital converter (ADC) having:
      a capacitor bank that is coupled to the first switching circuit, wherein the capacitor bank includes a plurality of weighted capacitors that are coupled in parallel with one another between the first switching circuit and a node,
      wherein the node is located within the SAR ADC;
      a comparator that is coupled to the node;
      SAR logic that is coupled to the comparator; and
      a second switching circuit that is coupled to the first switching circuit and that is controlled by the SAR logic; and
   an active gain,
   wherein the node further comprises a first node, and wherein the capacitive touch screen panel further comprises a plurality of sensing capacitors that are arranged in an array having a plurality of rows and a plurality of columns, wherein each column is associated with at least one of a plurality of second nodes, and wherein each sensing capacitor for each column is coupled to its associated second node,
   wherein the first switching circuit further comprises:
      a plurality of first switches, wherein each first switch is coupled between at least one of the second nodes and a third node; and
      a plurality of second switches, wherein each second switch is coupled between the third node and at least one of the plurality of weighted capacitors,
   wherein the third node is part of the capacitive touch screen panel.

2. The apparatus of claim 1, wherein the SAR ADC further comprises a charge pump that is coupled to the third node.

3. An apparatus comprising:
   a capacitive touch screen panel having:
      a first column of sensing capacitors that are each coupled to a first node; and
      a second column of sensing capacitors that are each coupled to a second node; and
   an active gain control circuit having:
      an amplifier that is coupled to the capacitive touch screen panel;
      a switch that is coupled to the capacitive touch screen panel; and
      a first switching circuit that is coupled to the amplifier and the switch;
   a SAR ADC having:
      a capacitor bank that is coupled to the first switching circuit, wherein the capacitor bank includes a plurality of weighted capacitors that are coupled in parallel with one another between the first switching circuit and a third node;
      wherein the third node" is part of the SAR ADC;
      a comparator that is coupled to the third node;
      SAR logic that is coupled to the comparator; and
      a second switching circuit that is coupled to the first switching circuit and that is controlled by the SAR logic:
   wherein the first switching circuit further comprises:
      a first switch that is coupled between the first node and a fourth node, wherein the fourth node is part of the capacitive touch-screen panel;
      a second switch that is coupled between the second node and the fourth node; and
      a plurality of third switches, wherein each second third switch is coupled between the fourth node and at least one of the plurality of weighted capacitors.

4. The apparatus of claim 3, wherein the first switching circuit further comprises:
   a fourth switch that is coupled between the first node and ground; and
   a fifth switch that is coupled between the second node and ground.

5. The apparatus of claim 4, wherein the SAR ADC further comprises a charge pump that is coupled to the third node.

* * * * *